(12) United States Patent
Dedic et al.

(10) Patent No.: US 12,232,264 B1
(45) Date of Patent: Feb. 18, 2025

(54) HIGH-Q SWITCH INDUCTOR

(71) Applicant: Acacia Communications, Inc., Maynard, MA (US)

(72) Inventors: Ian Dedic, London (GB); David Enright, Maldon (GB); Darren Walker, Reading (GB); Tarun Gupta, Santa Clara, CA (US)

(73) Assignee: ACACIA COMMUNICATIONS, INC., Maynard, MA (US)

( * ) Notice: Subject to any disclaimer, the term of this patent is extended or adjusted under 35 U.S.C. 154(b) by 1227 days.

(21) Appl. No.: 16/564,044

(22) Filed: Sep. 9, 2019

(51) Int. Cl.
*H01F 21/12* (2006.01)
*H01F 5/00* (2006.01)
*H01F 17/00* (2006.01)
*H01F 27/28* (2006.01)
*H01F 27/40* (2006.01)
*H01L 23/522* (2006.01)
*H01L 49/02* (2006.01)
*H05K 1/16* (2006.01)

(52) U.S. Cl.
CPC ............. *H05K 1/165* (2013.01); *H01F 5/003* (2013.01); *H01F 17/0013* (2013.01); *H01F 21/12* (2013.01); *H01F 27/2804* (2013.01); *H01F 27/40* (2013.01); *H01L 23/5227* (2013.01); *H01L 28/10* (2013.01); *H01F 2021/125* (2013.01)

(58) Field of Classification Search
CPC ............. H01F 17/0013; H01F 17/0006; H01F 27/2804; H01F 2027/2809; H01F 5/003; H01F 27/40; H01F 21/00; H01F 21/02; H01F 21/005; H01F 21/12; H01F 2021/125
USPC .................................................. 336/200, 232
See application file for complete search history.

(56) References Cited

U.S. PATENT DOCUMENTS

| 10,861,793 | B2 * | 12/2020 | Cheng | H01L 23/66 |
| 2004/0140528 | A1 * | 7/2004 | Kim | H01F 21/12 |
| | | | | 257/E21.022 |
| 2011/0051308 | A1 * | 3/2011 | Chan | H01F 21/12 |
| | | | | 361/268 |

(Continued)

FOREIGN PATENT DOCUMENTS

| GB | 2507160 A | * | 4/2014 | ............. H03F 1/565 |
| JP | 2007005498 A | * | 1/2007 | |

(Continued)

*Primary Examiner* — Tszfung J Chan
(74) *Attorney, Agent, or Firm* — K&L GATES LLP

(57) ABSTRACT

In an embodiment, an apparatus and system comprising a first inductor with a first diameter; and a switched inductor including a metal layer and a switch; wherein when the switch is closed the switch connects the metal layer of the switched inductor to form an inductor with a parallel circuit enabling current to flow through the switched conductor; and wherein when the switch is open, current is not enabled to flow through the switched conductor. In another embodiment, a method for tuning a high-Q inductor, the method comprising closing a switch of a switched inductor, wherein the switch connects the switched inductor to a first inductor; wherein closing the switch enables current to flow though the switched inductor as well as the first inductor to change the inductance of the high Q inductor.

15 Claims, 7 Drawing Sheets

(56) References Cited

U.S. PATENT DOCUMENTS

| | | | | |
|---|---|---|---|---|
| 2017/0237292 | A1* | 8/2017 | Jeong | B60L 53/122 |
| | | | | 307/104 |
| 2018/0226941 | A1* | 8/2018 | van Liempd | H03H 7/38 |
| 2019/0044564 | A1* | 2/2019 | Zhang | G06F 13/4086 |
| 2019/0245486 | A1* | 8/2019 | Ying | H01F 38/00 |

FOREIGN PATENT DOCUMENTS

| | | | | | |
|---|---|---|---|---|---|
| JP | 2008016703 | A | * | 1/2008 | |
| JP | 2008172442 | A | * | 7/2008 | B21D 28/06 |
| TW | 201430874 | A | * | 8/2014 | B21D 28/06 |

* cited by examiner

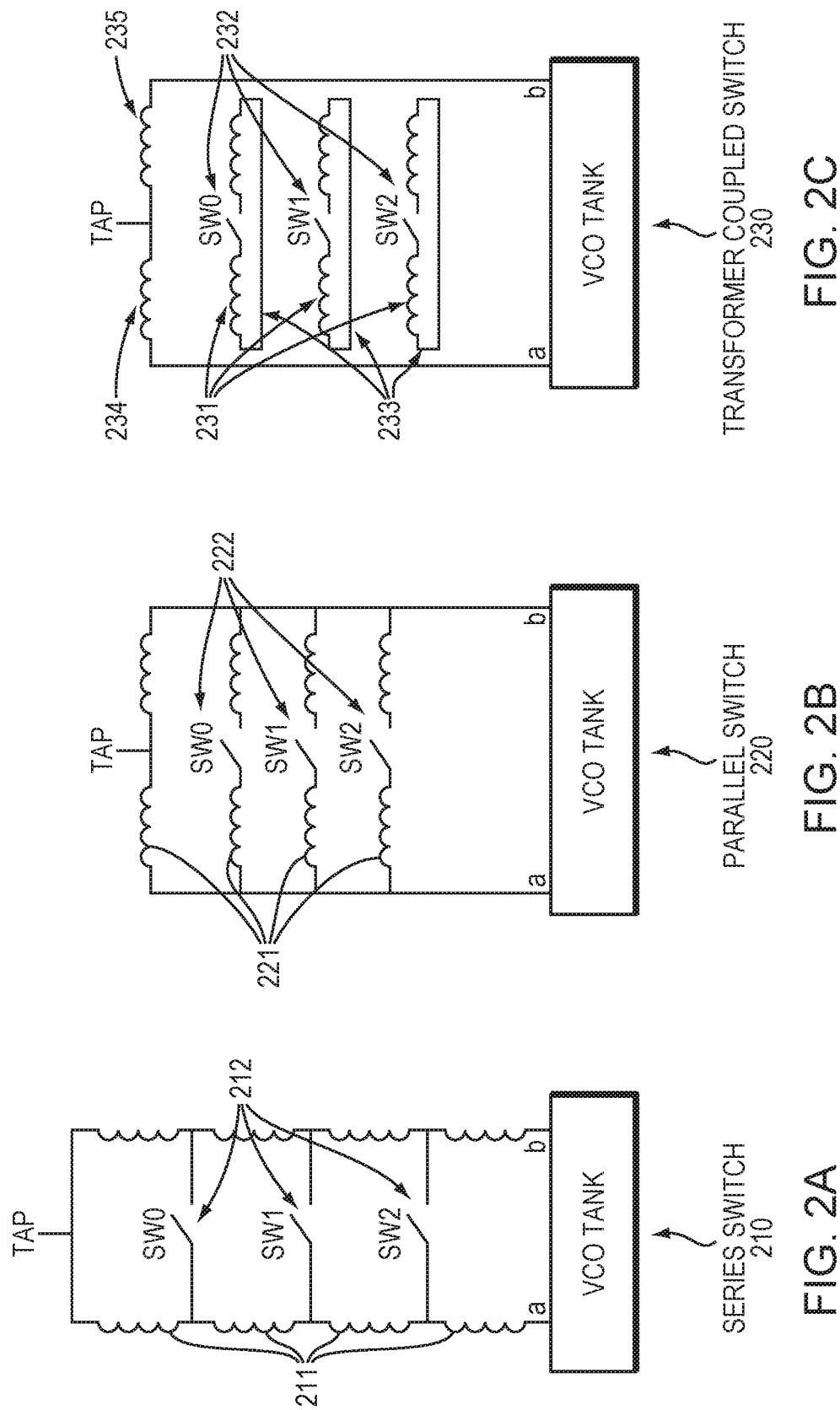

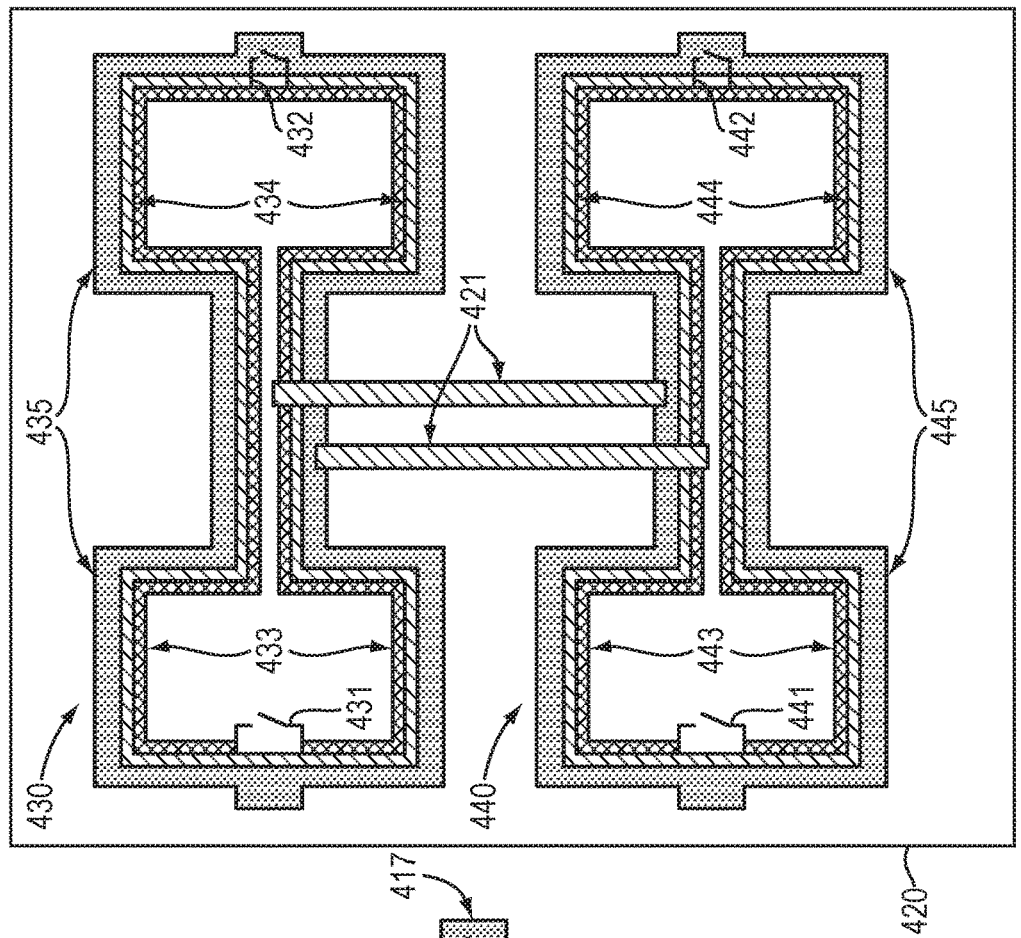
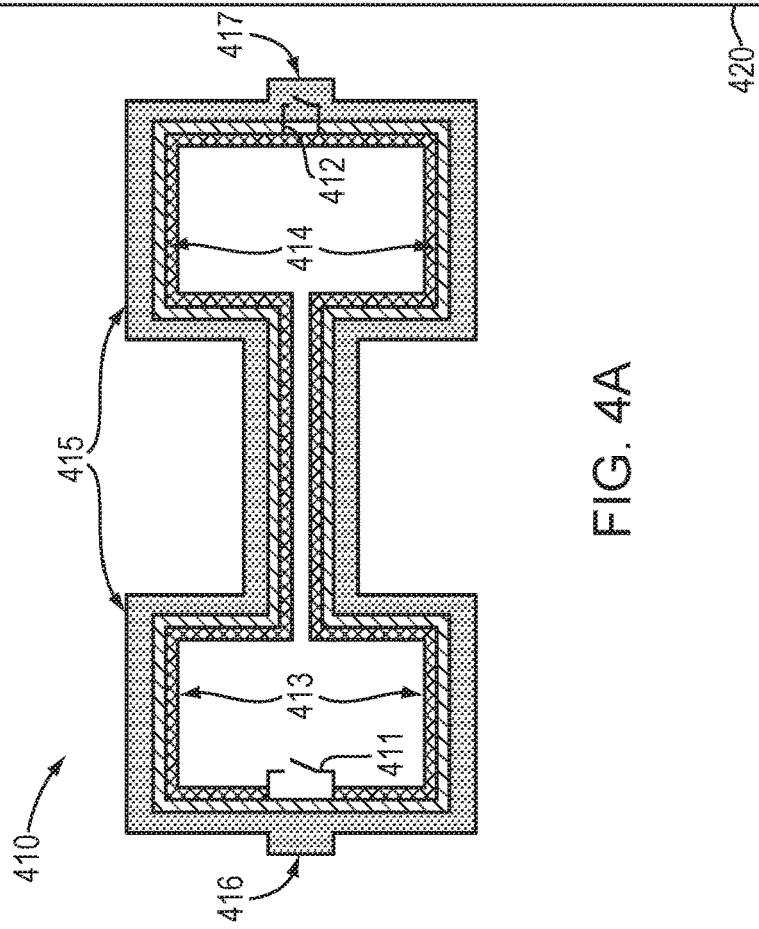
FIG. 4A
FIG. 4B

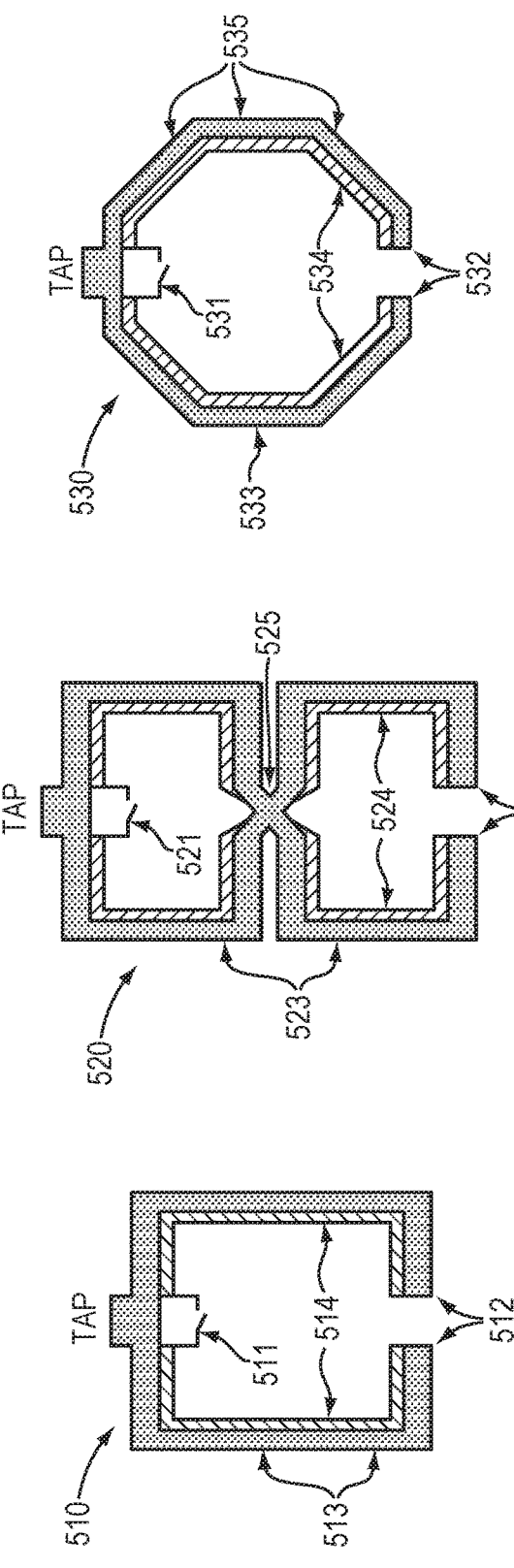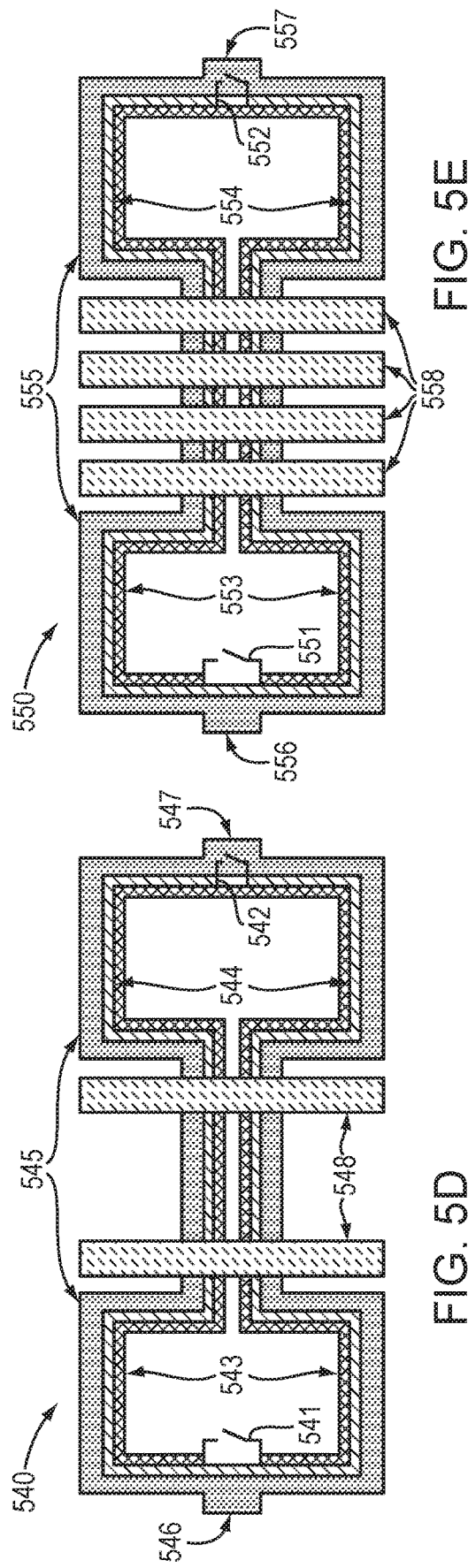

HIGH-Q SWITCH INDUCTOR

BACKGROUND

A clock may be used to provide a timing signal in a digital circuit.

BRIEF DESCRIPTION OF THE FIGURES

Various aspects and embodiments of the application will be described with reference to the following example embodiments. It should be appreciated that the figures are not necessarily drawn to scale.

FIG. 2a is a simplified illustration of a series switch, in accordance with an embodiment of the present disclosure;

FIG. 2b is a simplified illustration of a parallel switch, in accordance with an embodiment of the present disclosure;

FIG. 2c is a simplified illustration of a transformer coupled switch, in accordance with an embodiment of the present disclosure;

FIG. 4a is a simplified illustration of a switched inductor with multiple switched coils of different sizes in parallel, in accordance with an embodiment of the present disclosure;

FIG. 4b is a simplified illustration of two switched inductors with multiple switched coils of differing sizes in parallel, each in a dog-bone style and each inductor wired in parallel with the other, in accordance with an embodiment of the present disclosure;

FIG. 5a is a simplified illustration of a switched inductor with a single switched coil in a box style, in accordance with an embodiment of the present disclosure;

FIG. 5b is a simplified illustration of a switched inductor with a single switched coil in a figure-8 style, in accordance with an embodiment of the present disclosure;

FIG. 5c is a simplified illustration of a switched inductor with a single switched coil in an octagonal style, in accordance with an embodiment of the present disclosure;

FIG. 5d is a simplified illustration of a switched inductor with multiple switched coils in parallel in a dog-bone style, connected to two VCOs, in accordance with an embodiment of the present disclosure;

FIG. 5e is a simplified illustration of a switched inductor with multiple switched coils in parallel in a dog-bone style, connected to four VCOs, in accordance with an embodiment of the present disclosure;

SUMMARY

Figure 1:
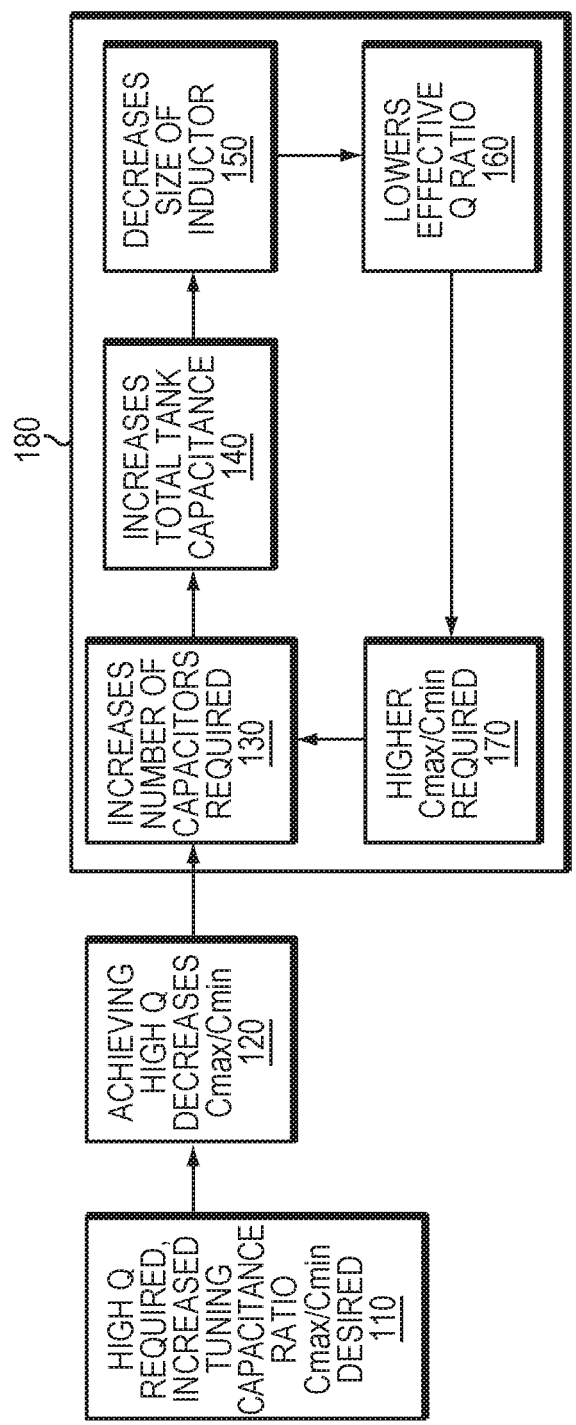
FIG. 1 is a simplified illustration of a method of increasing a tuning range while maintaining a high Q and the redundancy that results, in accordance with an embodiment of the present disclosure.

In an embodiment, an apparatus and system comprising a first inductor with a first diameter; and a switched inductor including a metal layer and a switch; wherein when the switch is closed the switch connects the metal layer of the switched inductor to form an inductor with a parallel circuit enabling current to flow through the switched conductor; and wherein when the switch is open, current is not enabled to flow through the switched conductor. In another embodiment, a method for tuning a high-Q inductor, the method comprising closing a switch of a switched inductor, wherein the switch connects the switched inductor to a first inductor; wherein closing the switch enables current to flow though the switched inductor as well as the first inductor to change the inductance of the high Q inductor.

DETAILED DESCRIPTION

In many embodiments, a communication or transmission system may include a transmitter and a receiver. In some embodiments, a communication system may include two transceivers. In most embodiments, a transmission, such as a set of bits, may be encoded in a signal at a transmitter. In most embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link.

In some embodiments in a coherent optical system, a digital electrical signal may be received. In certain embodiments, a digital electrical signal may be converted to an analog signal. In many embodiments, an analog signal may be converted to an optical signal. In most embodiments, a coherent optical communication system may have high data rates. In almost all embodiments, it may be necessary to divide data received into discrete time intervals. In many embodiments, in a coherent optical system it may be necessary to do a conversion between a digital signal and an analog signal at many gigabaud per second. In most embodiments, in a coherent optical signal, it may be necessary to convert an optical signal to an analog at many gigabaud per second. In some embodiments, in a coherent optical system, it may be necessary to convert an analog signal to an electronic signal at many gigabaud per second.

In most embodiments in a coherent optical system, a conversion between digital to analog, analog to optical, optical to analog, and analog to digital may need to run at speeds of 50-60 gigabaud or faster per second. In many embodiments, accuracy of a conversion may need to be high and signal to noise distortion of the signal may need to be low. In almost all embodiments, accurate conversion of a signal may require an accurate clock at both a transmission site and at a receive site. In most embodiments, a clock may need to run at a high speed and have very high slew rates. In many embodiments, if a clock moves in time, such as jittering backward or forward in time, this may introduce a time error into a communication system which may then introduce a voltage error which may degrade the accuracy of a communication. In some embodiments herein, jitter may refer to phase noise (i.e. random, undesired fluctuations) in the wave produced by a voltage-controlled oscillator (VCO).

In some embodiments, there may be 20 picoseconds between transmitted or received data samples. In certain embodiments, a clock may be used to denote the time between samples. In many embodiments, a same amount of jitter may create bigger voltage errors at higher frequencies.

In most embodiments, a clock may need to be distributed to each circuit or device that uses the clock. In many embodiments, a distribution of a clock may need to cover a big area.

In most embodiments, it may be necessary to have a clock to enable conversion of a signal. In many embodiments, a clock may need to provide a signal to denote a sampling time. In certain embodiments, a clock may need to be distributed to a number of different locations performing a conversion of a signal. In most embodiments, it may require power to distribute a clock to different locations. In further embodiments, it may require power to drive a clock.

In many embodiments, a clock may be a voltage-controlled oscillator (VCO). In most embodiments, a VCO may have a resonance tank or tank. In some embodiments, a tank may be formed by a resonance circuit with an inductor (L) and a capacitor (C). In certain embodiments, energy in a tank may flow between the L and the C at a given phase. In many embodiments, phase of a flow of energy around a tank of a VCO may denote a clock cycle. In most embodiments, tanks are referred to as having a Q ratio. In many embodiments, Q refers to the ratio between energy circulating around a tank and the amount of energy that is lost each time the energy flows around the tank. In most embodiments, a tank with a higher Q ratio is preferable as higher Q indicates lower energy loss for each clock cycle.

In some embodiments, the current disclosure may enable building a low-power, low jitter VCO. In many embodiments, a low jitter VCO may require a High-Q tank to minimize noise. In certain embodiments, to obtain a required VCO frequency tuning range to cover process variation and different frequency specifications a continuous varactor and some form of switched capacitor array may be required. In most embodiments, the current disclosure has realized that as geometries shrink and frequencies increase, a Q-factor of a switched capacitor arrays and varactors drop to where the switched capacitor arrays and varactors may be the dominate source of jitter. In some embodiments, minimizing sizes of switched capacitor arrays and varactors may enable a high-Q inductor that can be digitally tuned. In almost all embodiments, a "death spiral" may occur during an attempt to create a system with a high-Q inductor that can be digitally tuned. In many embodiments, a death spiral may occur when a system's tuning capacitance ratio is being increased while a desired tuning capacitance range of the system is high. In most embodiments, a tuning process may result in a system's single tuning capacitor or multiple tuning capacitors' size continuously growing, while power consumption may also be continuously growing.

In certain embodiments, the current disclosure may use a switched inductor in parallel to a switched capacitor array to achieve a required frequency tuning range. In many embodiments, circuits operating at frequencies of at least ten GHz (e.g. radar or mm-wave radio) may benefit from a high Q and an increased tuning range. In many embodiments, a switched inductor may enable a switched capacitor array to be smaller impacting the overall tank Q less and reducing VCO power because there is less capacitance to drive. In most embodiments, a switched inductor may not degrade Q of a tank when a switch of a capacitor is turned on and may be used in high frequency applications. In certain embodiments, the current disclosure may use multiple switched inductors in parallel to a switched capacitor array to achieve a frequency tuning range that may be broader than a range available with only one switched inductor.

In some embodiments, a voltage-controlled oscillator may require a method to provide coarse frequency tuning to account for differing frequency specifications. In many embodiments, a VCO may also be used to account for process or temperature variations within a system. In certain embodiments, an inductor or multiple inductors may be used with at least one copper layer in coordination with one or more switch capacitors or continuous varactors to maintain a high ratio between the amount of energy circulating within a system and the amount of energy lost with each cycle of the system (Q ratio).

In some embodiments, a VCO may be used in any circuit where it may be desired to increase the circuit's tuning range while maintaining a high Q. In further embodiments, either a Q of at least one voltage-controlled capacitor (varicap) or switched capacitor may be problematic in maintaining a high Q while increasing a circuit's tuning range. In many embodiments, achieving high Q may cause a decrease in a circuit's tuning capacitance range. In some embodiments, decreases in a circuit's tuning capacitance range may cause a circuit to require more capacitors. In many embodiments, increasing a number of capacitors in a circuit may increases the circuit's tank capacitance. In most embodiments, increasing a circuit's tank capacitance may cause a smaller inductor size. In many embodiments, a decreased inductor size on a circuit may lower the circuit's effective Q ratio. In some embodiments, a lower effective Q ratio of a circuit may increase a capacitance range required. In almost all embodiments, a cycle may exist and may continuously require increases in a size of a circuit's tuning capacitors and an amount of power the circuit consumes.

In some embodiments, a diameter of an inductor coil may be modified by including a smaller switched inductor within a larger inductor. In most embodiments, a smaller switched inductor may be placed within a conductor of any shape. In certain embodiments, a high-Q inductor may be laid out and in layers below another high-Q inductor, a coil layout may be repeated but shrunk to a smaller diameter. In many embodiments, a parallel inductor may be connected to a tank but left disconnected at a tap-point such that there are no shorted loops. In certain embodiments, a parallel inductor may be connected to a switch to create a shorted loop when a switch connecting the parallel inductor and another inductor is activated. In certain embodiments, multiple switch inductors may be used, and the multiple switch inductors may all be smaller than the larger inductor. In those embodiments, the multiple switched inductors may all have different sizes from each other. In other embodiments, some or all of multiple switched inductors may have the same size as each other.

In many embodiments, when a switch of a parallel inductor is open, the current may flow in a main coil, which may be the other parallel inductor, and either no or substantially little current may flow in the parallel inductor or parallel coil.

In most embodiments, when a switch of a parallel inductor is enabled, some of the current may flow in the parallel inductor, which may have a smaller coil than the other parallel inductor, which may effectively increase the width of the inductor. In some embodiments, a parallel inductor coil may be of higher resistance and when switched not all current flows in the smaller parallel inductor coil so switch resistance requirements may be relaxed compared to a conventional switched inductor where all the coil current flows through the switch.

In some embodiments, when there are multiple switch inductors, all or some of multiple switches of multiple switch inductors may be enabled, which may allow current to flow through all or some of the multiple switch inductors. In further embodiments, different combinations of the multiple switches may be enabled, which may allow for differing inductance values for each or some of the combinations.

In most embodiments, use of a switched parallel inductor may mean that another parallel high-Q inductor may dominate overall Q of a combined inductor, i.e. both parallel inductors with a switch, when the switch is on or off. In almost all embodiments, use of a parallel switched inductor to an inductor with a larger diameter may be different to other techniques because the Q is not degraded considerably when the inductor switch is enabled and it may be used in high frequency applications.

In most embodiments, a design may aim to maximize Q to minimize power required for function. In many embodiments, a system may be center-tapped to the transmitter or receiver system and connected to a VCO tank at two points. In some embodiments, maximizing Q may increase jitter from a VCO's switch capacitor arrays and varactors. In many embodiments, jitter from a VCO's switch capacitor arrays and varactors may become a dominant source of jitter. In some embodiments, different methods of incorporating inductors and switch capacitors or varactors may be used to minimize size of the inductor and switch capacitors, which may reduce the amount of jitter produced.

Conventional techniques, known as series switches, use multi-turned inductors, with switches run in parallel and inductors run in series, with an additional inductor preceding and following each switch in series with the entire center-tapped system. In other conventional techniques, known as parallel switches, inductors may precede and follow each individual switch, with each inductor-switch series being run in parallel with each other throughout the entire center-tapped system. Further conventional techniques, known as transformer coupled switches, use inductively coupled loops to cause an eddy current to change the overall inductance of the center-tapped system. However, conventional techniques may negatively impact a Q of a tank.

Consider a typical example of series switches and parallel switches that may require a total resistance of the inductor-switch system of less than 1.65 ohms to maintain a Q of at least 15 at 40 gigahertz. In this typical example, it may be possible to design the inductor to have a 100 picohenry inductance with a resistance of no more than 0.6 ohms (without accounting for skin effect resistance) so that the switch could be less than one ohm. In this typical example, the inductor-switch system may require a large amount of area. In this typical example, if a current switch device (CSD) of the switch is too large, it may cause an AC short across a switch at high frequencies, which may in turn cause a self-resonant frequency (SRF) of an overall inductor to degrade. In this typical example, a size of a CSD may limit the size of a switch. In this typical example, in most transformer coupled switches, use of eddy currents to change an overall inductance may cause an inductor's Q to be reduced in proportion to disturbance of main inductor fields. In most embodiments, the current disclosure has realized it may be beneficial to overcome the limitations of conventional techniques.

In certain embodiments of the current disclosure, a high-Q center-tapped inductor, called a primary inductor, may be laid out and composed of a high level metal, where high may refer to the location of the inductor in the metal relative to other layers. In some embodiments, an inductor may be connected to a VCO tank at two points. In further embodiments, a second inductor, called a secondary inductor, may be composed of a low level metal with a smaller inner diameter, and placed in parallel with a primary inductor, where low may denote a location in the metal relative to other layers of the metal. In certain embodiments of the current disclosure, a first inductor and a second inductor may be connected to a tank at the same points. In some embodiments with a first and second conductor, a secondary inductor may have a small switch inserted. In most embodiment with multiple inductors or switched inductors, each inductor or switched inductor may be laid out in a different layer of metal. In almost all embodiments with multiple inductors or switched inductors, each inductor or switched inductor may not come in physical contact with each other inductor or switched inductor other than where each inductor or switched inductor is connected to a VCO tank.

In further embodiments with a first and second inductor, when a switch is open on the second conductor all or most of a current may flow through the first inductor. In many embodiments with a first and second inductor, the first high-Q primary inductor may dominate an overall Q of a system when a switch on the second inductor is closed, as a higher resistance of the secondary inductor and smaller surface area of the second inductor may result in only a small portion of the total current flowing through the secondary inductor. In some embodiments with two inductors, potential dominance of a first inductor over overall Q of a system may allow much higher switch resistance with less impact to the system's Q value than in conventional solutions. In further embodiments, multiple inductors may allow a switch area to be smaller, which may thus minimize the CSD so that a SRF of the inductor when the switch is open is not impacted. In other embodiments, parallel conductor design may be used in any inductor shape, including but not limited to figure-8 or octagonal styles. In still further embodiments, multiple inductors of varying levels and decreasing diameters may be connected together using one or more switches.

Refer now to the example embodiment of FIG. 1. FIG. 1 shows an example embodiment of utilizing a VCO in a high-frequency circuit while attempting to maintain a high Q ratio and increase the high-frequency circuit's tuning range. In this example embodiment, death spiral 180 results when trying to get a reasonable tuning range at high frequencies. In the example embodiment of FIG. 1, a system requires a high Q ratio, while also desiring a high tuning capacitance ratio (step 110). In this example embodiment, achieving high Q (step 120) decreases the tuning capacitance ratio, which requires an increased number of capacitors (step 130). Increasing the number of capacitors increases the tank capacitance (step 140). Increasing the tank capacitance decreases the effective size of the circuit's inductor (step 150). Decreasing the effective size of the inductor lowers the circuit's effective Q ratio (step 160). Decreasing a circuit's effective Q ratio results in a need to increase a system's tuning capacitance ratio (step 170), which causes cycle 180 (the "death spiral") to repeat itself.

Refer now to the example embodiments of FIGS. 2a and 2b. These example embodiments illustrate types of inductors that may be used to simultaneously maximize a circuit's Q ratio while also increasing the circuit's tuning range. FIG. 2a shows example embodiment of series switch 210. The example embodiment of FIG. 2a uses multi-turned inductor 210 where several coils 211 are shorted out by using switches 212 to effectively remove some of the coils 211 to reduce the inductance. FIG. 2b shows an example embodiment of parallel switch 220. The example embodiment of FIG. 2b features parallel turns 221, as contracted to the series turns of FIG. 2a, and uses parallel switches 222. The example embodiments of FIGS. 2a and 2b have an effective limit to the size of a switch while also requiring low resistance on the switch.

In a specific embodiment, a 100 pH inductor has an impedance of 25 Ohms at 40 GHZ, and, to maintain a Q ratio of at least 15, the total resistance of a switch must be less than 1.65 Ohms. In this specific embodiment, when using a higher level metal, it is possible to design a 100 pH inductor with less than 0.6 Ohms, and this requires the switch to be less than 1 Ohm. In the same embodiment, this is possible with a switch of sufficient size, but CSDs of large size can cause an AC short across the switch at high frequencies. In this embodiment, the AC short degrades the overall self-resonant frequency (SRF) of the overall inductor, and the size of the CSD limits the size of the switch and the functionality and efficiency of this specific embodiment.

Refer now to the example embodiment of FIG. 2c. FIG. 2c shows transformer coupled switch 230. FIG. 2c generally illustrates inductively coupled loops 233, each with its own inductor 231 and switch 232, placed within circuit 235 with inductors 234. Inductively coupled loops 233 cause an eddy current, which reduces the overall tank inductance. In FIG. 2c, reliance on eddy currents results in the Q ratio lowering with any disturbance in the inductor fields. In the example embodiments of FIGS. 2a, 2b, and 2c, the current disclosure has realized that these example embodiments have negative limitations on the Q ratio of a tank.

Figure 3B:
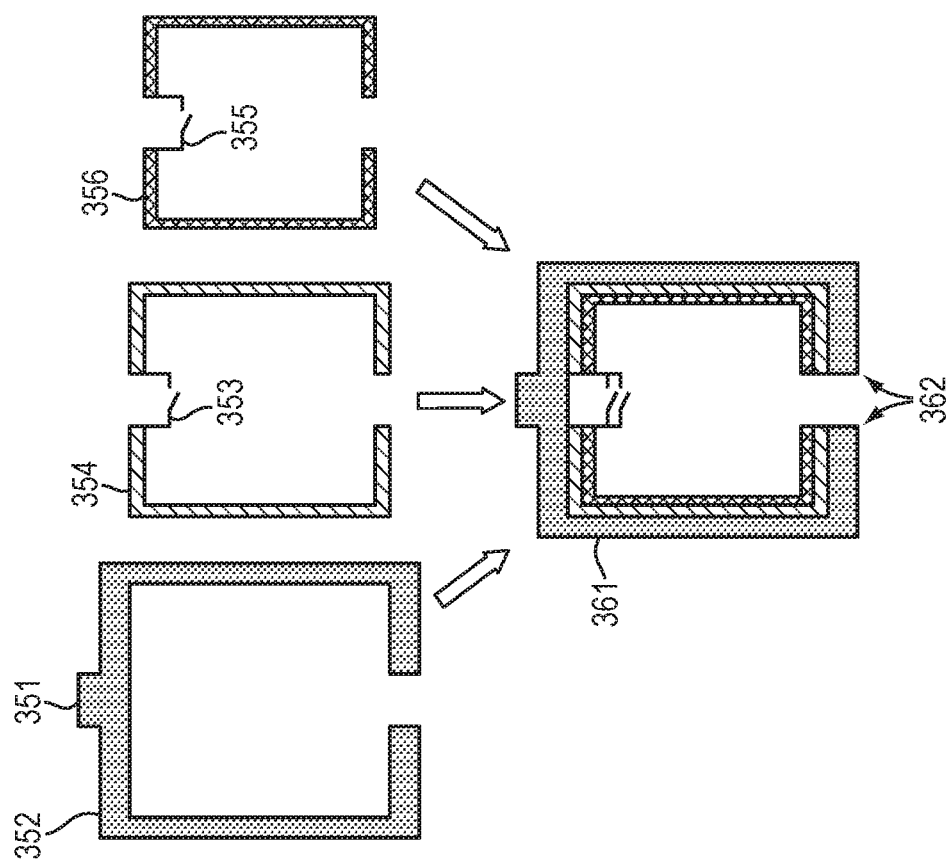
FIG. 3b is a simplified illustration of a switched inductor with multiple switched coils, in accordance with an embodiment of the present disclosure.
Figure 3A:
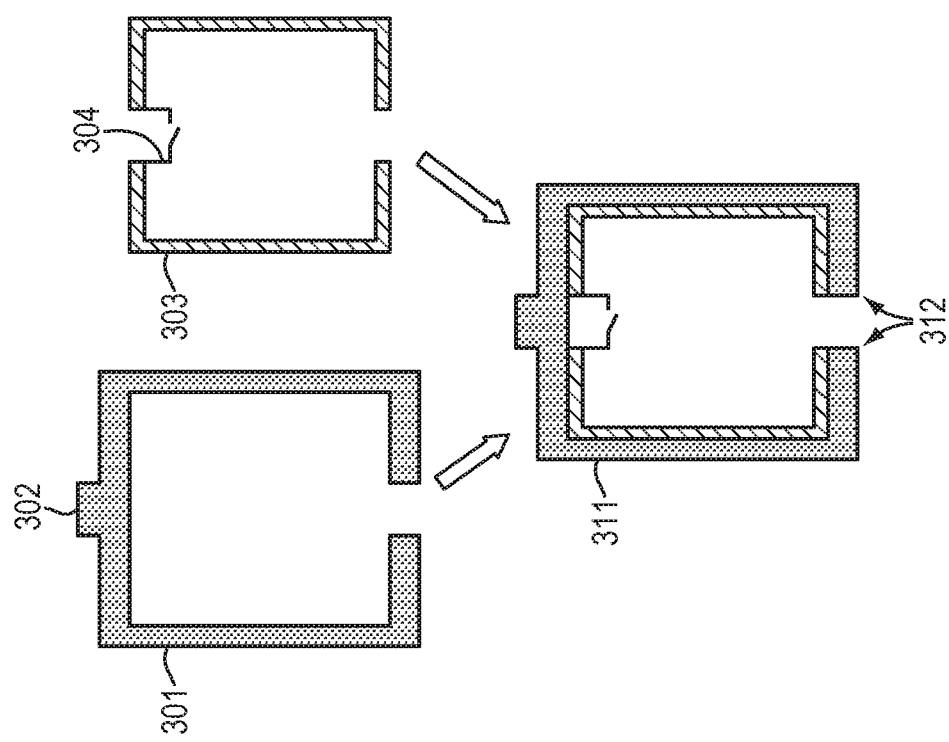
FIG. 3a is a simplified illustration of the construction of a switched inductor with a single switched coil, in accordance with an embodiment of the present disclosure.

Refer now to the example embodiment of FIG. 3a. This figure shows a high-q switched inductor with a single switched coil. Primary inductor 301, a high-Q inductor, is laid out and composed of a high level metal. Primary inductor 301 has tap 304, a center-tap to a system utilizing circuit 311. Secondary inductor 302 is composed of a low level metal with a smaller inner diameter than primary inductor 301. Secondary inductor 302 has switch 303. Primary inductor 301 and secondary inductor 303 are placed in a parallel circuit with each other, forming parallel circuit 311, which is collectively connected to a VCO tank at location 312. When switch 303 is open, circuit 311's inductance is at a maximum. When switch 303 is closed, circuit 311's inductance is at a minimum.

Refer now to the example embodiment of FIG. 3b. This figure shows an inductor with two switched coils. Primary inductor 352 is laid out and composed of a high level metal. Primary inductor 352 has tap 351, a center-tap to a system utilizing circuit 361. Secondary inductor 354 is composed of a low level metal with a smaller inner diameter than primary inductor 352 and switch 353. Secondary inductor 356 is composed of a low level metal with an inner diameter that is smaller than primary inductor 352 and different from the inner diameter of secondary inductor 354. Secondary inductor 356 has switch 355. Primary inductor 352 and secondary inductors 354 and 356 are placed in a parallel circuit with each other, forming parallel circuit 361, which is collectively connected to a VCO tank at location 362. When switch 353 and switch 355 are both open, circuit 361's inductance is at a maximum. When switch 353 and switch 355 are both closed, circuit 361's inductance is at a minimum. When either, but not both, switch 353 or 355 are closed, circuit 361's inductance will be at an intermediate value between the minimum and maximum value. Due to the differing diameters of secondary inductor 354 and secondary 356, the intermediate inductance value will be different depending on which switch is closed.

In a specific embodiment, an inductor can exhibit multiple switched coils, where the number of switched coils is n. In this specific embodiment, there are n^2 inductor settings. Due to this relationship, increasing the number of switched coils allows for greater variance in the frequency bands an inductor can accommodate.

Refer now to the example embodiments of FIGS. 4a and 4b. FIG. 4a shows dog-bone shaped inductor 410, which consists of a parallel circuit of primary inductor 415 and secondary inductors 413 and 414. Primary inductor 415, composed of a high level metal, has a greater diameter than both secondary inductors 413 and 414, which are composed of a low level metal. Secondary inductors 413 and 414 have different diameters from each other, and each has its own switch, switches 411 and 412, respectively. When both switches 411 and 412 are open, inductor 400's inductance is at its maximum value. When both switches 411 and 412 are closed, inductor 400's inductance is at its minimum value. When either, but not both, switch 411 or 412 are closed, inductor 410's inductance will be at an intermediate value between the minimum and maximum value. Due to the differing diameters of secondary inductor 413 and 414, the intermediate inductance value will be different depending on which switch is closed. FIG. 4b shows circuit 420 of parallel dog-bone shaped inductors 430 and 440, connected via single switching coils 421. Dog-bone shaped inductor 430 consists of a parallel circuit of primary inductor 435 and secondary inductors 433 and 434. Primary inductor 435, composed of a high level metal, has a greater diameter than both secondary inductors 433 and 434, which are composed of a low level metal. Secondary inductors 433 and 434 have different diameters from each other, and each has its own switch, switches 431 and 432, respectively. Dog-bone shaped inductor 440 consists of a parallel circuit of primary inductor 445 and secondary inductors 443 and 444. Primary inductor 445, composed of a high level metal, has a greater diameter than both secondary inductors 443 and 444, which are composed of a low level metal. Secondary inductors 443 and 444 have different diameters from each other, and each has its own switch, switches 441 and 442, respectively. In other embodiments, each inductor may have a different number of switched coils, and those coils may have different sizes.

Refer now to the example embodiments of FIGS. 5a, 5b, and 5c. These example embodiments show some examples of the various shapes a parallel switched inductor may take, including but not limited to a box, as shown in FIG. 5a, a figure-8, as shown in FIG. 5b, or an octagon, as shown in FIG. 5c. The example embodiment of FIG. 5a shows "box" shaped inductor 510, with 4 sides at right angles to each other, with singular switch 511 opposite in orientation to connections 512 to a VCO tank. Primary inductor 513, composed of a high level metal, is in parallel circuit with secondary inductor 514, composed of a low level metal, which exhibits switch 511, and both are laid in the box shape. The example embodiment of FIG. 4b shows "figure-8" shaped inductor 520, with singular switch 521 opposite in orientation to connections 522 to a VCO tank but separated by the crossing 525 of either side of the inductor. Inductor 520 retains the general circuitry of FIG. 5a's primary inductor 513 relative to secondary inductor 514, with primary inductor 523, composed of a high level metal, in parallel circuit with secondary inductor 524, composed of a low level metal and containing switch 521. Both primary inductor 523 and secondary inductor 524 are laid in the octagon shape. The example embodiment of FIG. 4c shows "octagon" shaped inductor 530, with 8 sides 535, and switch 531 opposite in orientation to VCO connections 532. Primary inductor 533, composed of a high level metal, is in parallel circuit with secondary inductor 534, composed of a lower level metal, with each in the same shape with 8 sides 535.

While the example of embodiments of FIGS. 5a, 5b, and 5c generally illustrate differences in shape from each other, each exhibits enables changing of inductance of an inductor through the use of a switch.

Refer now to the example embodiments of FIGS. 5d and 5e. FIG. 5d shows inductor 540, which consists of a parallel circuit of primary inductor 545, composed of a high level metal, and secondary inductors 543 and 544, each composed of a low level metal. The diameters of secondary inductors 543 and 544 are less than the diameter of primary inductor 545, and secondary inductors 543 and 544 exhibit switches 541 and 542, respectively. Inductor 540 is tapped at two points, taps 546 and 547, and is laid out in a dog-bone shape. Inductor 540 is connected to two VCOs at points 548. FIG. 5e shows inductor 550, which consists of a parallel circuit of primary inductor 545, composed of a high level metal, and secondary inductors 553 and 554, each composed of a low level metal. The diameters of secondary inductors 553 and 554 are less than the diameter of primary inductor 555, and secondary inductors 553 and 554 exhibit switches 551 and 552, respectively. Inductor 550 is tapped at two points, taps 556 and 557, and is laid out in a dog-bone shape. Inductor 550 is connected to four VCOs at points 558.

The difference between FIGS. 5d and 5e illustrates generally how, in specific embodiments, dog-bone shaped inductors may have several different VCOs connected between the two ends of the shape. In some embodiments, spacing of VCO tank connections may allow for the reduction of hot spots along the circuitry.

Figure 6:
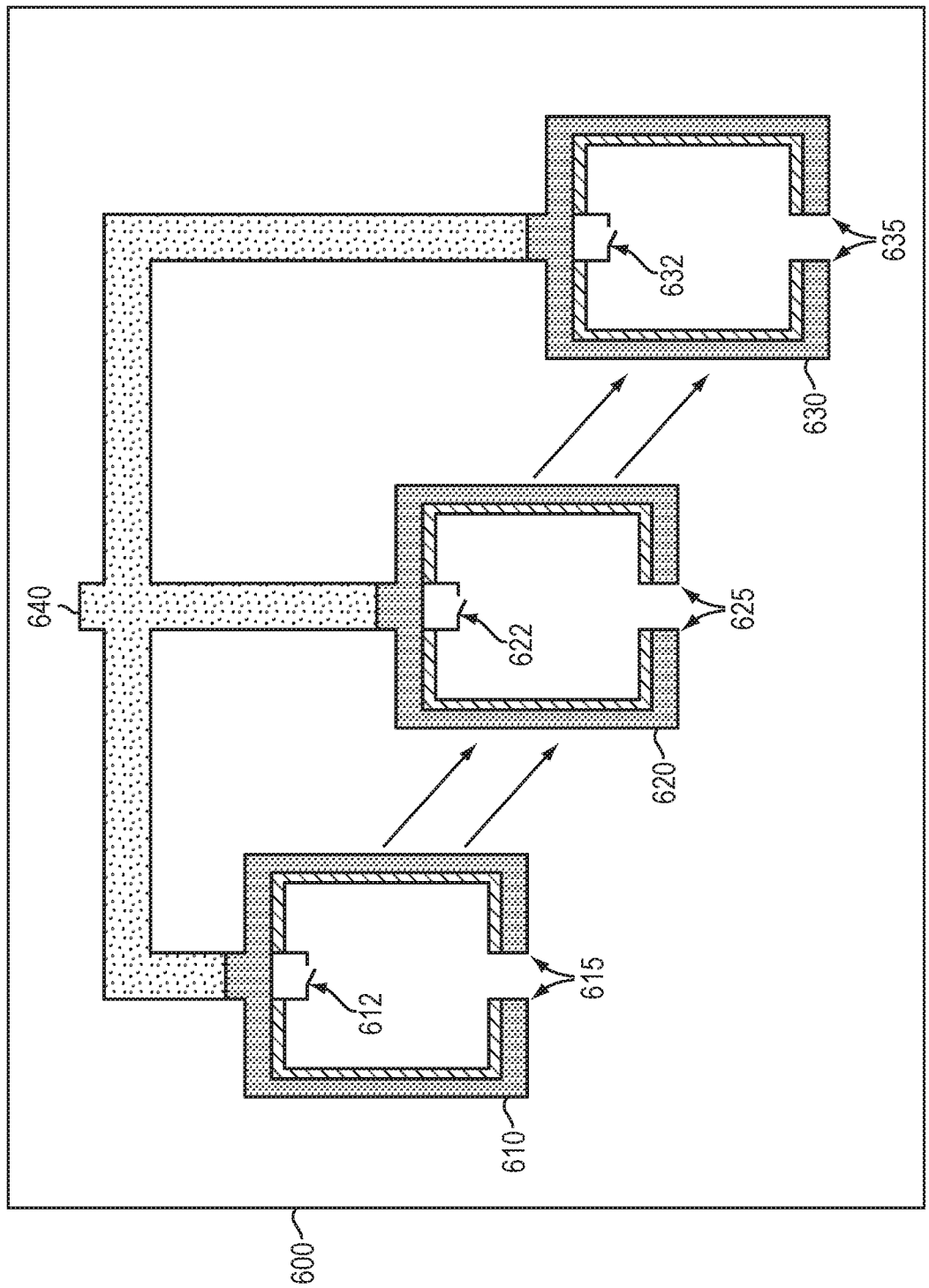
FIG. 6 is a simplified illustration of a switched inductor laid out in multiple layers with other switch inductors, in accordance with an embodiment of the current disclosure.

Refer now to the example embodiment of FIG. 6. This example embodiment shows system 500, an example embodiment of multiple, stacked parallel inductors 610, 620, and 630. Parallel switch inductors 610, 620, and 630 are laid in parallel, each with its own switch, switches 612, 622, and 632, respectively. The array of parallel switch inductors 610, 620, and 630 is center-tapped to the circuit's outside system at singular tap 640. Each of the inductors 610, 620, and 630 are connected to VCOs at points 615, 625, and 635, respectively. In other example embodiments, more or less inductors may also be used in an array of inductors. In additional example embodiments, a system of multiple parallel switch inductor arrays may be used, with multiple taps or a singular tap for the system of arrays.

Figure 7:
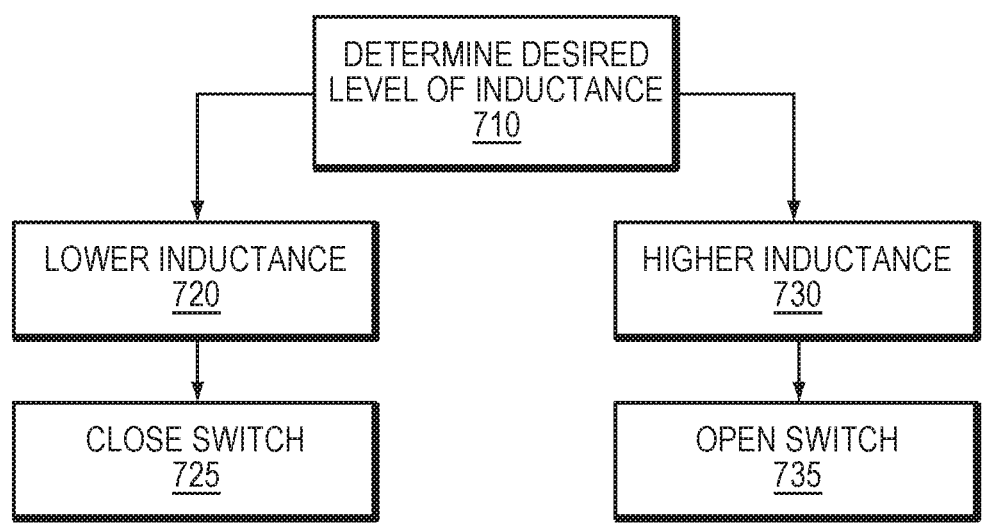
FIG. 7 is a simplified illustration of a method for maximizing the Q ratio and minimizing the power needed for operation of a circuit by use of a variable inductance inductor, in accordance with an embodiment of the present disclosure.

Refer now to the example embodiment of FIG. 7. FIG. 7 is an example method of use of a parallel switch inductor. In this example embodiment, use of a parallel switch inductor requires a determination of a desired level of inductance of a system in use (step 710). The system can require either a lower level of inductance (step 720) or a higher level of inductance (step 730). If a lower level of inductance is needed (step 720), the system will closes a switch, such as switch 303 of FIG. 3a's secondary inductor 302 (step 725). If higher inductance is needed (step 730), the system opens a switch, such as switch 303 of FIG. 3a's secondary inductor 302 (step 735).

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Although the present invention is defined in the attached claims, it should be understood that the present invention can also (alternatively) be defined in accordance with the following embodiments:

1. A method for tuning a high-Q inductor, the method comprising:
   closing a switch of a switched inductor, wherein the switch connects the switched inductor to a first inductor; wherein the first inductor has a first diameter wherein the switched inductor has a second diameter; wherein the second diameter is less than the first diameter; and wherein:
   closing the switch enables current to flow though the switched inductor as well as the first inductor to change an inductance of the high Q inductor, and
   opening the switch enables current to flow through the first inductor and current is not enabled to flow through the switched inductor.
2. The method of embodiment 1 further comprising:
   closing a second switch of a second switched inductor, wherein the second switch connects the second switched inductor to a first inductor; wherein the first inductor has a first diameter wherein the second switched inductor has a third diameter, wherein the third diameter is less than the first diameter; and wherein closing the second switch enables current to flow though the second switched inductor as well as the first inductor to change the inductance of the high Q inductor.

3. The method of embodiment 2, wherein the third diameter is the same value as the second diameter.

4. A system comprising:
   a first inductor with a first diameter; and
   a switched inductor including a metal layer and a switch; wherein:
   the metal layer of the switched inductor has a second diameter less than the first diameter; wherein the switch, when closed, connects the metal layer of the switched inductor to form an inductor and current is enabled to flow through the switched inductor and the first inductor; and wherein, when the switch is open, current is not enabled to flow through the switched inductor but is enabled to flow through the first inductor.

5. The system of embodiment 4 further comprising:
   a second switched inductor including a second metal layer and a second switch; wherein:
   the second metal layer of the second switched inductor has a third diameter;
   wherein the third diameter is less than the first diameter; wherein, when the second switch, is closed the second switch connects the second metal layer of the second switched inductor to form a second inductor enabling current to flow through the second switched inductor; and wherein when the second switch is open, current is not enabled to flow through the second switched inductor.

6. The system of embodiment 5 wherein the third diameter is a different value than the second diameter.

7. The system of embodiment 5 wherein the third diameter is the same value as the second diameter.

8. An apparatus comprising:
   a first inductor with a first diameter; and
   a switched inductor including a metal layer and a switch; wherein:
   the metal layer of the switched inductor has a second diameter; wherein the second diameter is less than the first diameter; wherein, when the switch is closed, the switch connects the metal layer of the switched inductor to form an inductor, enabling current to flow through the switched inductor and the first inductor; and wherein, when the switch is open, current is not enabled to flow through the switched inductor but is enabled to flow through the first inductor.

9. The apparatus of embodiment 8 further comprising:
   a second switched inductor including a second metal layer and a second switch; wherein:
   the second metal layer of the second switched inductor has a third diameter;
   wherein the third diameter is less than the first diameter; and wherein when the second switch is closed the second switch connects the second metal layer of the second switched inductor to form a second inductor enabling current to flow through the second switched inductor; and wherein, when the second switch is open, current is not enabled to flow through the second switched inductor.

10. The apparatus of embodiment 9, wherein the apparatus is connected to a set of VCOs including a first VCO and a second VCO;

11. The apparatus of embodiment 10, wherein the first switched inductor and the second switched inductor operate at a mean of a frequency of each VCO in the set of VCOs.

12. The method of embodiment 2, wherein the first inductor, the first switched inductor, and the second switched inductor are connected to a set of VCOs including a first VCO and a second VCO.

13. The method of embodiment 12, wherein the first switched inductor and the second switched inductor operate at a mean of a frequency of each VCO in the set of VCOs.

14. The system of embodiment 5, wherein the first inductor, the first switched inductor, and the second switched inductor are connected to a set of VCOs including a first VCO and a second VCO.

15. The system of embodiment 14, wherein the first switched inductor and the second switched inductor operate at a mean of a frequency of each VCO in the set of VCOs.

What is claimed is:

1. An apparatus, comprising:
   a first inductor comprising at least one tap, wherein the first inductor has a first diameter, and wherein the at least one tap is configured to couple the apparatus to at least one of a transmitter or a receiver;
   a switched inductor comprising a metal layer and a switch, wherein the metal layer of the switched inductor has a second diameter, wherein the second diameter is less than the first diameter, wherein, when the switch is closed, the switch connects the metal layer of the switched inductor to form an inductor, enabling current to flow through the switched inductor and the first inductor, and wherein, when the switch is open, current is not enabled to flow through the switched inductor but is enabled to flow through the first inductor; and
   at least two connection points configured to couple the apparatus to a voltage-controlled oscillator.

2. The apparatus of claim 1, wherein the first inductor comprises a high level metal.

3. The apparatus of claim 1, wherein the metal layer comprises a low level metal.

4. The apparatus of claim 1, wherein the voltage-controlled oscillator comprises a tank or a resonance tank.

5. The apparatus of claim 1 further comprising:
   a second switched inductor including a second metal layer and a second switch; wherein:
   the second metal layer of the second switched inductor has a third diameter; wherein the third diameter is less than the first diameter; and wherein, when the second switch is closed, the second switch connects the second metal layer of the second switched inductor to form a second inductor enabling current to flow through the second switched inductor; and wherein, when the second switch is open, current is not enabled to flow through the second switched inductor.

6. The apparatus of claim 5 wherein the third diameter is a different value than the second diameter.

7. The apparatus of claim 5 wherein the second diameter and the third diameter are of equal size.

8. The apparatus of claim 1, wherein the first inductor and the switched inductor are quadrilateral inductors.

9. A system, comprising:
   a first inductor comprising at least one tap, wherein the first inductor has a first diameter, and wherein the at least one tap is configured to couple the system to at least one of a transmitter or a receiver;

a switched inductor comprising a metal layer and a switch, wherein the metal layer of the switched inductor has a second diameter less than the first diameter, wherein, when the switch is closed, the switch connects the metal layer of the switched inductor to form an inductor, enabling current to flow through the switched inductor and the first inductor, and wherein, when the switch is open, current is not enabled to flow through the switched inductor but is enabled to flow through the first inductor; and at least two connection points configured to couple the system to a voltage-controlled oscillator.

10. The system of claim 9, wherein the first inductor is composed of a high level metal.

11. The system of claim 9, wherein the switched inductor is composed of a low level metal.

12. The system of claim 9, wherein the voltage-controlled oscillator comprises a tank or a resonance tank.

13. The system of claim 9, wherein the system utilizes multiple sets of first and switched inductors individually connected in parallel.

14. The system of claim 9, further comprising:
a second switched inductor including a second metal layer and a second switch; wherein:
the second metal layer of the second switched inductor has a third diameter; wherein the third diameter is less than the first diameter; wherein, when the second switch is closed, the second switch connects the second metal layer of the second switched inductor to form a second inductor enabling current to flow through the second switched inductor; and wherein, when the second switch is open, current is not enabled to flow through the second switched inductor.

15. The system of claim 9, wherein the first inductor and the switched inductor are quadrilateral inductors.

* * * * *